United States Patent [19]

Jackson et al.

[11] Patent Number: 4,550,047
[45] Date of Patent: Oct. 29, 1985

[54] SILICON SOURCE COMPONENT FOR USE IN MOLECULAR BEAM EPITAXIAL GROWTH APPARATUS

[75] Inventors: Thomas N. Jackson, Peekskill; Peter D. Kirchner, Crompond; George D. Pettit, Mahopac; James J. Rosenberg, Bronx; Jerry M. Woodall, Bedford Hills; Steven L. Wright, Yorktown Heights, all of N.Y.

[73] Assignee: International Business Machines Corporation, Armonk, N.Y.

[21] Appl. No.: 501,571
[22] Filed: Jun. 6, 1983
[51] Int. Cl.[4] .................. B32B 3/10; C30B 23/04
[52] U.S. Cl. .................... 428/136; 118/726; 156/610; 156/DIG. 103; 148/DIG. 169
[58] Field of Search ............. 156/610, 612, DIG. 64, 156/DIG. 103, DIG. 111; 422/245, 247; 428/450, 620, 630, 641, 136, 596, 600; 118/726; 148/DIG. 169

[56] References Cited

U.S. PATENT DOCUMENTS

| | | | |
|---|---|---|---|
| 3,172,778 | 3/1965 | Günther et al. | 156/612 |
| 4,066,482 | 1/1978 | Shaw | 156/612 |
| 4,099,305 | 7/1978 | Cho et al. | 156/612 |
| 4,171,234 | 10/1979 | Nagata et al. | 156/612 |
| 4,333,792 | 6/1982 | Smith | 156/DIG. 88 |

FOREIGN PATENT DOCUMENTS 14193  5/1978  Japan .................. 156/DIG. 64

OTHER PUBLICATIONS

Craig et al., "The Interpretation of Mass Spectra in Vacuum Measurements", vol. 16, No. 2, pp. 67–73, (1966).
Rai et al., "Lattice Incorporation of n-Type Dopants in GaAs", Appl. Phys. Lett. 41(11), Dec. 1, 1982, pp. 1086–1088.
Hultgren et al., editors: *Selected Values of the Thermodynamic Properties of the Elements*, American Society for Metals, Metals Park, Ohio, pp. 465–471.
Collins, D. M., "The Use of SnTe as the Source of Donor Impurities in GaAs Grown by Molecular Beam Epitaxy", Appl. Phys. Lett. 35(1), Jul. 1, 1979, pp. 67–70.
Metze et al., "Dependence of the Electrical Characteristics of Heavily Ge-Doped GaAs etc.", Appl. Phys. Lett. 37(2), Jul. 15, 1980, pp. 165–167.
Harris et al., "Aggregation Effects During MBE Growth of GaAs Doped with Sn", presented at Third Annual Workshop on MBE, U. of Calif. at Santa Barbara (1981).
Chai et al., "Incorporation of SnTe in MBE GaAs", presented at the Second Annual Workshop on MBE, Cornell Univ. Ithaca, N.Y., (1980).
Kirchner et al., "Volatile Metal Oxide Incorporation in Layers of GaAs and $Ga_{1-x}Al_xAs$ Grown by MBE", J. Vac. Sci. Technol. 19(3), Sep./Oct. 1981, pp 604–606.
DeSimone et al., *Doping Limits in MBE GaAs*, presented at the Third Annual Workshop on Molecular Beam Epitaxy, Univ. of Calif. at Santa Barbara, (1981).
Chai et al, *The Effect of Growth Conditions on Si Incorporation in Molecular Beam Epitaxal GaAs*, Appl. Phys. Lett. pp. 800–803, 39(10), (1981).
Drummond et al., *Si Incorporation in $Al_xGa_{1-x}As$ Grown by Molecular Beam Epitaxy*, J. Vac. Sci. Technol., 21(4), Nov./Dec. 1982, pp. 957–960.
Feng et al., "Si Doped GaAs Using a $SiCl_4$ Technique in a $AsCl_3/Ga/H_2$ CVD System for MESFET", Inst. Phys. Conf. Ser. No. 56, Chapter 1, pp. 1–7, (1981).
Miller et al., "GaAS–AlGaAs Tunnel Junctions for Multigap Cascade Solar Cells", J. Appl. Phys. 53(1) Jan. 1982, pp. 744–748.
M. W. Geis et al., Crystallographic Orientation of Silicon on an Amorphous Substrate Using an Artificial Surface-Relief Grating and Laser Crystallization, Appl. Phys. Lett. 35(1), Jul. 1, 1979, pp. 71–74.

*Primary Examiner*—David L. Lacey
*Attorney, Agent, or Firm*—Alvin J. Riddles

[57] ABSTRACT

A quantity of silicon serving as a source of the element silicon for use in a molecular beam epitaxial growth apparatus where the silicon is in the form of a monocrystalline wafer with a plurality of electrically parallel filaments separated by slots that pass completely through the wafer, each filament having a length dimension that is greater than the width and height dimensions, joined at a broad contact area at each filament end and where an electric current is passed through the filaments through the broad contact areas.

6 Claims, 2 Drawing Figures

SILICON SOURCE COMPONENT FOR USE IN MOLECULAR BEAM EPITAXIAL GROWTH APPARATUS

DESCRIPTION

Technical Field

The invention is an improved source of silicon for use in connection with the molecular beam epitaxy technique (MBE) of growing crystals. As crystalline devices are employed in more applications, and in particular in semiconductor applications, the requirements on the crystalline structure and the dopant elements within the structure have become more stringent. The technique of MBE provides control of the ingredients of the crystal to such a degree that monolayers of atoms are achievable.

The present semiconductor structures such as High Electron Mobility Transistors (HEMT) and Tunneling Junction Devices are requiring crystal composition and doping level changes over distances as small as a few atom layers.

The control and crystal quality of MBE, however, are influenced by the ability within the MBE system to provide a uniform flux of the correct atoms and to be able to change that flux abruptly during the growth of the crystal. There has been a great deal of attention focused in the art on the problems of providing atomic fluxes of different elements in MBE while at the same time preventing conditions favorable for a particular element from being detrimental to the others or to the enhancement of the inclusion in the grown crystal of undesirable impurity substances. The element silicon has many useful applications in the crystalline field but heretofore in the art there have been problems in incorporating it into MBE crystals. Whether the silicon is being incorporated as a principal ingredient of the crystal or as a dopant in a crystal of other ingredients, there has been difficulty maintaining a uniform atom flux. Since the control required for an atom flux for an impurity is greater, the art has focused attention on those problems. Two illustrative discussions of the effect of the many conditions on the use of silicon in molecular beam epitaxy are provided in Appl. Phys. Lett. 39 (10), Nov. 15, 1981, p. 800 and J. Vac. Sci. Technol., 21 (4), Nov./Dec. 1982, p. 957, which indicate that the nature of the silicon properties make it difficult to control.

DISCLOSURE OF THE INVENTION

Figure 1:
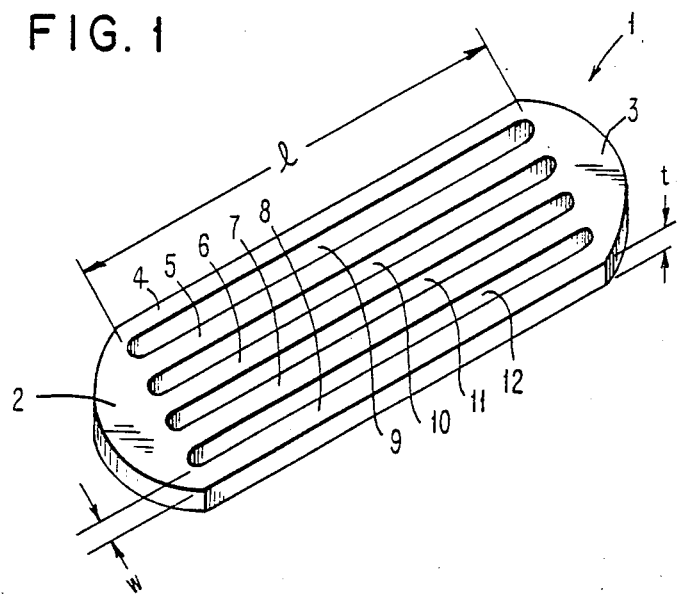
FIG. 1 is an illustration of the silicon MBE source structure of the invention.

The invention is a monocrystalline quantity of silicon in a particular shape that permits it to be self-heated using electrical current passing through it for use as a silicon source for MBE. Referring to FIG. 1, a schematic view of the silicon source of the invention is provided. In FIG. 1, highly pure silicon in the form of a wafer 1 is shaped so that there are two electrical connection broad ends 2 and 3 and between them a plurality, shown as elements 4 to 8, separated by slots 9 to 12, of filaments each having width (w) and thickness (t) dimensions, each of which is substantially less than the length (l).

It will be apparent to one skilled in the art, in the light of the principles set forth, that as many filaments as space in the molecular beam epitaxy apparatus may be employed. The structure of FIG. 1 may be produced for example by ultrasonic machining or etching of the slots 9 to 12 in a silicon wafer.

The invention provides a controlled uniform high purity atom flux from a silicon filament structure with low thermal inertia. One major problem with using current to heat silicon is that as current flows and heat is produced, the resistivity of a silicon member would decrease. The decrease in turn permits more current to flow in localized, non-uniform manner. Thus, if a uniform silicon wafer were electrically heated by passing current through it in this manner, uniform heating would not occur.

This property of silicon which results in nonuniform heating is the negative temperature coefficient of resistivity.

In accordance with the invention, the negative temperature coefficient of resistivity is utilized by the presence of multiple filaments.

In operation, at a given instant only one filament will be hot and will provide the silicon flux. Since the resistance of each silicon filament is the product of $\rho$, the resistivity, and the length l divided by the cross-sectional area $w \times t$, and the atom flux emanating is proportional to the surface area, an advantage is gained by increasing the length l with respect to the other dimensions. The added filaments are also useful in providing multiple sequential sources for completing a growth operation without breaking a vacuum should a burnout occur; they provide mechanical integrity and low thermal inertia.

Figure 2:
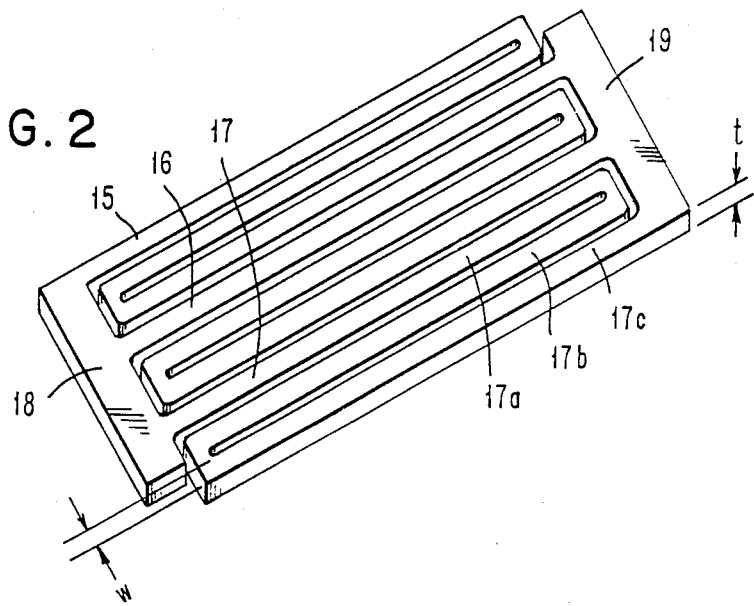
FIG. 2 is an illustration of a variation of the silicon MBE source structure of the invention.

A structure illustrating this feature is shown in FIG. 2 where the length l of the filaments is increased with respect to the cross-sectional area by having the filament double back and forth between the contacts. In FIG. 2 only three filaments are shown for illustration. The usual limitation on number of filaments is the physical space available in the apparatus. The filaments, labelled elements 15, 16 and 17, each have common contact areas 18 and 19. In each filament the width (w) and thickness (t) dimensions making up the cross-sectional area remain constant while the length (l) being made up of the three segments 17a, 17b and 17c in series is being shown in FIG. 2 for the filament 17 and that each of the filaments 15 and 16 would have their own respective three segments 15a, 15b, 15c and 16a, 16b and 16c.

The principle involved is to make the length (l) dimension greater with respect to the cross-sectional area $(w) \times (t)$ by doubling the filament back and forth and positioning the electrical contact areas at the appropriate points. Since the emanating atom flux is proportional to the filament surface area, using the principle of FIG. 2, compared to FIG. 1 there are large increases, of the order of 10 times in atom flux.

The invention, as may be seen from the principles disclosed, is applicable to both growth and dopant types of sources of silicon for use in MBE applications. For clarity of explanation and efficiency, a detailed discussion will be directed to the specific and more stringent application of the use of silicon as a source of a dopant in the molecular beam epitaxial growth of GaAs and GaAlAs with silicon. In the light of the principles set forth, one skilled in the art will readily make the transition to other types of sources and other specific materials.

In molecular beam epitaxy (MBE), crystalline structures are grown by evaporating the desired constituents in an ultra-high vacuum (UHV) environment. The constituents are supplied for two general purposes, that of supplying the ingredients to grow the crystal and that of supplying a dopant for the crystal. The apparatus of the MBE system usually has a central location with conditions maintained for the growth of the crystal and a plurality of ingredient source locations with the growth and dopant sources at those locations under separate control so as to produce and deliver an atom flux of each ingredient at the growing interface of the crystal.

The ingredient sources which effuse the major constituents used in growing the crystal have larger volumes, about 10 to 100 milliliters in most of today's apparatus, to supply the large volumes needed. These growth sources need to produce a uniform steady atom flux with control on rate. A source used to supply a dopant will evolve less material but under more rigorous control conditions. Since the dopant may be added in quantities as small as parts per billion and as high as percent levels yet the dopant is required to be in varying concentrations and to have abruptly changing concentrations, dopant sources must provide a broad uniform atom flux but that flux must be controllable both as to rates much lower than growth ingredients and there must be the ability to provide abrupt variations. The variation is usually obtained by changing the temperature of the source and by employing a shutter to terminate the flux. Multiple sources at different temperatures are necessary for step changes in level.

This invention is of negligible thermal mass so that its temperature and hence the flux can be changed almost instantaneously of the order of less than 1 second, and on the order of the time necessary to activate a mechanical shutter. Thus, a shutter with its attendant disadvantages is unnecessary.

There are four fundamental capabilities that an ingredient source in MBE should be able to provide. First, the source must be able to supply an atom flux spatially uniform over the growing surface. Second, the source must be stable over the time of the growth. Third, the source should not introduce detrimental material or impurities directly or introduce such impurities indirectly through the conditions required to produce the atom flux. Fourth, the source should be capable of rapid changes in theevolved atom flux which in the case of a dopant source requires very rapid changes with respect to the growth rate.

A linguistic distinction will be employed since dopants in semiconductor terminology have been called impurities and in molecular beam epitaxy conditions the high temperatures and ultra high vacuums permit atoms to appear in the growing crystal from contacts and crucibles, all of which are impurities in the sense that they are detrimental to the precise composition of the crystal. An intentional dopant will be called a dopant and all other detrimental material will be called impurities.

The element silicon has a number of physical characteristics that frustrate required controllability and add complexity to its use in MBE. Since silicon is exceptionally non-volatile, it is difficult to form a high purity atom flux. When used as a dopant, particularly at high doping levels, in multielement crystals such as GaAS, it tends to self-compensate at such high doping levels. In other words, the Si enters different sublattices of the crystal and affects conductivity differently.

In accordance with the invention, the plurality of parallel filaments permits focusing and confining the heat at the silicon so that the only significant heat generated is at the atom flux producing region. As the silicon becomes hotter, the semiconductor properties produce a decrease of resistance. Thus, one filament will predominantly carry the current. Since there is little mass at the point of flux evolvement, thermal inertia is low and abrupt changes in current can produce abrupt changes in flux.

The advantages of the invention can be appreciated by a comparison with the art as presently practiced. The fields associated with radio frequency heating have been found to be detrimental to this type of crystal growth. There are at this time in the art only two conventional approaches for evaporating silicon to produce a silicon flux for use in MBE. In one, a tantalum mesh is employed for resistance heating of a crucible holding the silicon. In this first approach, tantalum is used as the heat shield and pyrolytic boron nitride is used for the crucible. A second approach uses an electron beam applied to the silicon for evaporation and the equipment is arranged so that everything out of the electron beam area that could produce impurities is being cooled. In both of these approaches there is much thermal inertia and step changes in atom flux can only be accomplished with multiple sources and by opening and closing shutters, separating the sources from the growth location. Every time heat is applied to other than the silicon itself, impurities are released into the system and are incorporated into the growing crystal. In this type of operation, the magnitude of such contamination is usually measured by such techniques as line of sight mass spectrometry.

As an example of the considerations involved, in a molecular beam epitaxy apparatus of the prior art type, at the temperatures necessary for low level doping, of the order of $10^{17}$ atoms per $cm^{-3}$ in gallium arsenide, grown at a rate of 1 micron per hour, at a temperature of about 1100° C., the pyrolytic boron nitride used for the crucible in the first approach will evolve carbon monoxide (CO) in quantities greater than the silicon atom flux. The situation becomes worse when the silicon temperature is raised to about 1200° C. to provide an atom flux sufficient for $2 \times 10^{18} cm^{-3}$ doping. At such a temperature, nitrogen ($N_2$) presumably from the crucible becomes the predominant effluent. Such conditions make it impossible to calibrate for silicon in such apparatus by pressure measurements because the majority of the effusate is not silicon. Even if the growth chamber geometry in apparatus where the silicon is indirectly heated to high temperatures is changed to permit line-of-sight mass spectrometry directly on the silicon (Si) source effluent, the silicon effluent will still be obscured by the $N_2$ and CO which in addition to Si are all at mass 28 with secondary peaks at mass 14.

The second prior art approach using electron beam (E-beam) evaporation has some advantages but carries with it a different set of problems. In the E-beam system the silicon source can be configured so that only the electron emitting E-beam filament and parts of the silicon become very hot. This heat however is so intense that radiant heating of the chamber walls can produce severe purity problems in the growing crystal even though the silicon source itself is ostensibly pure. There is also a second problem with the E-beam apparatus in that relatively minor changes in E-beam characteristics can cause substantial changes in evaporation rates. This in turn requires that there be built into the apparatus feedback controls. A third problem is high-energy charged-particle and X-ray generation which compromises crystal quality. In general the E-beam technique produces more unwanted contaminants or impurities than does the directly heated crucible of pyrolytic boron nitride at low doping levels.

It will be apparent that there are so many compromises that have to be made to the apparatus and to the silicon source configurations that progress in this art has been limited in Si doping in GaAs to achieving about $5 \times 10^{18}/cm^3$ at an abruptness of change of over 50 angstroms whereas in fact there are devices in the art the specifications of which are established that are very difficult to produce reliably and repetitively today, such as the high electron mobility transistor requiring crystal doping interfaces to change over 20 angstroms at doping densities of as high as $10^{19}$ or greater. This type device is such that bound atoms in the crystal at an interface have electrons that influence conditions in the crystal on the other side of that interface. To achieve this type of structure repetitively and reliably, the control has to be more stringent than any achievable heretofore.

In accordance with the invention a major step is achieved by providing the geometrically configured silicon source such that the only region that gets hot is the region at which the atom flux effuses. The invention achieves this by shaping the silicon and using its peculiar properties so that direct passing of current through the silicon can be employed.

Silicon melts at about 1685° K. or 1413° C. at which temperature the vapor pressure is about $3.5 \times 10^{-7}$ atmospheres or $2.66 \times 10^{-4}$ torr. At micron per hour growth rates, as are common in MBE, percent level incorporation of silicon atoms in the growing crystal can be achieved with silicon fluxes produced from a source that is near or below the melting point.

There are many interdependent advantages gained by the structural features of the invention.

In accordance with the invention the silicon is configured to confine the current by the dimensions through providing a plurality of controlled cross-sectional area filaments between electrical contact regions. Since the filaments are much longer than wide or thick, conduction of heat to the contacts is minimized and in turn this reduces and minimizes a source of unwanted contaminants in the crystal.

At operating temperatures, the major heat loss mechanism from the geometrical configuration of the invention is radiative and follows the black body law of power $\alpha$ Temperature$^4$ which permits silicon flux prediction accurately from input power.

The structure of the invention will provide precisely controllable atom fluxes over many powers of ten. Further, because the radiative losses of the filament in its operating range are large, there is very low thermal inertia so that the atom flux can be almost instantaneously changed by changing the applied power. Since step changes in the current supplied are mirrored by nearly step change in the filament temperature and in turn the evolved flux a step change in growing crystal composition is achieved. At micron per hour growth rates, approximately one atomic monolayer is formed in a second. The silicon source of the invention will respond well within that second leading to monolayer abruptness of dopant levels. The structure of the invention permits positioning as close as several filament lengths, yet the pattern of flux from the filament is still satisfactorily uniform.

The structure of the invention provides goodmechanical support of the filament and minimizes heating anything other than the filament. The multiple filaments further provide assistance in the prevention of breakage from mechanical stress and thermal shock and since the negative thermal resistance permits the multiple filaments to be electrically in parallel each filament is used as needed. When the voltage is applied to the parallel combination of filaments for a time, all will draw roughly the same relatively low current. Due to variations in cross-sectional area, conductivity or temperature, one filament will begin to draw more and more current.

When a filament burns out or breaks, the remaining filaments will draw the current. However, for a very long growth run of several hours, only a small fraction of one filament is consumed. The current in operation is such that the silicon is below the melting point. There is a change in resistivity from "off" to "on" of the order of 2000 which indicates that structures with around 200 filaments would be possible. From a mechanical standpoint the strains imposed through the contacts both in handling and due to the temperature changes each use, are distributed among the several filaments and hence the silicon source of the invention provides a structure considerably less fragile and more reliable than a single filament source.

As the growth rate requirements become greater so that shorter distances between source and growth substrate are desired, the longer length to cross-sectional area as shown in FIG. 2 isbeneficial for the purposes of uniformity.

BEST MODE FOR CARRYING OUT THE INVENTION

In a specific implementation of the invention along the lines of FIG. 2, a p-type silicon wafer is provided with boron doping to $10^{15}/cm^3$ with the wafer surface corresponding to a crystallographic orientation of [100]. The wafer is 0.015 inches thick and 2.25 inches in diameter. The boron doping was selected because of low volatility and the fact that boron is isoelectronic in III–V materials such as GaAs, should any of the boron contaminate the growing crystal. The slots defining the filaments are etched through the wafer to form filaments 1 mm wide by 2 cm long. While three pass filaments are shown for illustrative purposes in FIG. 2, in practice on a 2.25 inch wafer around 4 five pass filaments of 2.5 cm $\times$ 1 mm may be formed.

The electrical contact is provided using high purity tantalum or molybdenum. A block is employed as a rigid contact at one end of the silicon source and a clip about 0.005 inches thick forms a mechanically floating contact at the other end that minimizes strain on the filaments. Electrical contact is enhanced by sputtering tantalum on tothe contact area. The molybdenum electrical and supporting contacts are in turn held by copper feedthroughs which can serve as cold fingers to help cool the contacts and in turn the copper feedthrough can even be placed in liquid nitrogen should further cooling be needed.

Mechanically, the combined strength of the multiple filaments permits handling without extensive care.

In order to permit one skilled in the art in practicing this technology to have a perspective the following results are provided.

In growing a GaAs crystal using the silicon source of the invention with single pass filaments as shown in FIG. 1, the Si filament in use was cleaned at about 1300° C. The GaAs substrate for the GaAs crystal was maintained at 600° C. Under these conditions a current of 1.5 amperes produces a $1.5 \times 10^{17}$ Si atoms/cm$^3$ concentration in the crystal. A test at room temperature of the mobility which was determined to be 4020 cm$^2$/volt second, indicates that the silicon serves as an n-type impurity and that there is minimal compensation in the crystal. By increasing the current through the silicon to 2 amperes, a doping level of $2.5 \times 10^{18}$ Si atoms/cm$^3$ in the crystal is produced. The room temperature mobility test indicated 2180 cm$^2$/volt second. This indicates the typical mild compensation that for silicon increases with doping level. A test on negligible freeze-out of carriers at 77° K. provides an indication that the donors are shallow. Extreme doping levels are achieved by still further increasing the current to 2.5 amperes producing an electron concentration of $8.2 \times 10^{18}$ Si electrons/cm$^{-3}$. The mobility test indicated 1460 cm$^2$/volt second, indicating a silicon density of about $1.6 \times 10^{19}$ cm$^{-3}$.

The results are growth substrate temperature independent and there was no observable silicon precipitation in the layers.

What has been described is a silicon source for molecular beam epitaxial growth apparatus wherein heat produced by current flow through the silicon is confined to the region of atom flux and the geometrical configuration accommodates the temperature difference in conductivity and stresses.

Having thus described our invention, what we claim as new and desire to secure by Letters Patent is:

1. A source component for use in a molecular beam epitaxial growth apparatus wherein elemental silicon that is to be incorporated in the grown crystal is converted into a molecular beam which delivers an atom flux of silicon in contact with the growing crystal surface said silicon source component comprising in combination;

a monocrystalline silicon member in wafer shape
having first and second broad area electrical contact receiving regions,
said contact receiving regions being connected to each other through a plurality of electrically parallel filaments,
said filaments being essentially identical in length,
said length dimension being substantially greater than the width and height dimensions of each said filament,
each said filament being separated from an adjacent filament by a slot that passes completely through said wafer.

2. The component of claim 1 wherein each said filament has the length dimension thereof extended by being formed of multiple electrically series segments between said contact receiving regions.

3. A source of silicon component to be converted into and transported by a molecular beam in a molecular beam epitaxial growth apparatus comprising in combination;

a monocrystalline silicon wafer member
having a thickness dimension and
a series of parallel slots through said wafer that separate a central portion of said wafer into a plurality of essentially equal width dimension filaments,
said central portion being longer than said thickness or said width dimensions.

4. The silicon source component of claim 3 wherein said length dimension involves a plurality of electrically series connected transverse segments in said central portion.

5. A source of silicon component to be converted into and transported by a molecular beam in a molecular beam epitaxial growth apparatus comprising in combination;

a silicon source component in wafer form geometrically configured to provide two broad area electrical contact regions connected by a plurality of parallel identical cross secctional filaments,
each said filament having larger length than width and thickness dimensions,
each said filament being separated by slots that pass completely through said wafer.

6. The silicon source component of claim 5 wherein each said filament traversesthe distance between said broader area electrical contact regions more than once before making contact with a respective said broader area electrical contact region.

* * * * *